(12) United States Patent
Mauder et al.

(10) Patent No.: US 8,741,736 B2
(45) Date of Patent: Jun. 3, 2014

(54) SEMICONDUCTOR DEVICE WITH IMPROVED ON-RESISTANCE

(71) Applicant: Infineon Technologies Austria AG, Villach (AT)

(72) Inventors: Anton Mauder, Kolbermoor (DE); Rudolf Berger, Regensburg (DE); Franz Hirler, Isen (DE); Ralf Siemieniec, Villach (AT); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/960,215

(22) Filed: Aug. 6, 2013

(65) Prior Publication Data

US 2013/0323897 A1    Dec. 5, 2013

Related U.S. Application Data

(62) Division of application No. 13/463,243, filed on May 3, 2012, now Pat. No. 8,502,315, which is a division of application No. 12/633,956, filed on Dec. 9, 2009, now Pat. No. 8,198,678.

(51) Int. Cl.
*H01L 21/336* (2006.01)

(52) U.S. Cl.
USPC .......... 438/433; 438/434; 438/447; 438/270; 438/272; 438/454

(58) Field of Classification Search
USPC .............. 438/270, 272, 433, 434, 447, 454
See application file for complete search history.

(56) References Cited

U.S. PATENT DOCUMENTS

| | | | |
|---|---|---|---|
| 4,941,026 A | 7/1990 | Temple | |
| 5,936,291 A | 8/1999 | Makita et al. | |
| 6,114,727 A * | 9/2000 | Ogura et al. | 257/342 |
| 6,509,233 B2 | 1/2003 | Chang et al. | |
| 6,525,373 B1 * | 2/2003 | Kim | 257/330 |
| 6,690,062 B2 | 2/2004 | Henninger et al. | |

(Continued)

FOREIGN PATENT DOCUMENTS

| | | |
|---|---|---|
| DE | 10007415 | 9/2001 |
| DE | 102005041322 | 3/2007 |

(Continued)

OTHER PUBLICATIONS

"A New Robust Power MOSFET Family in the Voltage Range 80 V-150 V with Superior Low Rdson, Excellent Switching Properties and Improved Body Diode", Andreas Schloegl, et al., 2006, (10 pgs.).

(Continued)

*Primary Examiner* — Eugene Lee
(74) *Attorney, Agent, or Firm* — Dicke, Billig & Czaja, PLLC

(57) ABSTRACT

A semiconductor device includes a source, a drain, and a gate configured to selectively enable a current to pass between the source and the drain. The semiconductor device includes a drift zone between the source and the drain and a first field plate adjacent the drift zone. The semiconductor device includes a dielectric layer electrically isolating the first field plate from the drift zone and charges within the dielectric layer close to an interface of the dielectric layer adjacent the drift zone.

12 Claims, 11 Drawing Sheets

(56) References Cited

U.S. PATENT DOCUMENTS

| | | |
|---|---|---|
| 6,870,220 B2 | 3/2005 | Kocon et al. |
| 7,091,573 B2 | 8/2006 | Hirler et al. |
| 7,122,860 B2 | 10/2006 | Peake et al. |
| 7,186,618 B2 | 3/2007 | Polzl et al. |
| 7,642,597 B2 | 1/2010 | Saito |
| 7,989,293 B2 * | 8/2011 | Blanchard et al. ............ 438/270 |
| 8,084,865 B2 | 12/2011 | Hirler et al. |
| 8,466,025 B2 * | 6/2013 | Zeng et al. .................... 438/270 |
| 2002/0030237 A1 | 3/2002 | Omura et al. |
| 2005/0275016 A1 | 12/2005 | Qu |
| 2008/0073707 A1 | 3/2008 | Darwish |
| 2008/0135931 A1 | 6/2008 | Challa et al. |
| 2008/0164516 A1 | 7/2008 | Darwish |
| 2010/0219462 A1 | 9/2010 | Darwish et al. |

FOREIGN PATENT DOCUMENTS

| | | |
|---|---|---|
| JP | H08-255919 | 10/1996 |
| JP | H10-223904 | 8/1998 |
| JP | 2002-083963 | 3/2002 |
| JP | 2005-354056 | 12/2005 |
| JP | 2006-080249 | 3/2006 |
| JP | 2007-529115 | 10/2007 |
| JP | 2008124346 | 5/2008 |
| JP | 2008227514 | 9/2008 |
| JP | 2009027139 | 2/2009 |
| WO | 2005/065385 | 7/2005 |
| WO | 2008/086348 | 7/2008 |

OTHER PUBLICATIONS

"COOLMOS—A New Milestone in High Voltage Power MOS", L. Lorenz, et al., Siemens AG, 2002, (8 pgs.).

"Theoretical Evaluation of Maximum Doping Concentration, Breakdown Voltage and On-State Resistance of Field-Plate Compensated Devices", I. Pawel, et al., Infineon Technologies Austria AG, 2008, (7 pgs.).

Non-Final Office Action Feb. 25, 2011 in U.S. Appl. No. 12/633,956.

* cited by examiner

US 8,741,736 B2

SEMICONDUCTOR DEVICE WITH IMPROVED ON-RESISTANCE

CROSS-REFERENCE TO RELATED APPLICATIONS

This Utility patent application is a divisional application of U.S. application Ser. No. 13/463,243, filed May 3, 2012 which is a divisional application of U.S. application Ser. No. 12/633,956, filed Dec. 9, 2009, both of which are incorporated herein by reference.

BACKGROUND

The on-resistance of a typical high voltage power metal-oxide semiconductor field effect transistor (MOSFET) is dominated by the resistance of the voltage sustaining drift zone. The blocking voltage capability of the drift zone is typically based on its thickness and doping. To increase the blocking voltage, the doping of the drift zone is typically reduced and the layer thickness is increased. The on-resistance of the typical transistor therefore increases disproportionately strongly as a function of its blocking voltage capability. For a 600V transistor, for example, the drift zone contributes over 95% of the total on-resistance. Thus, to improve the performance of power MOSFETs, the drift region resistance should be reduced.

For these and other reasons, there is a need for the present invention.

SUMMARY

One embodiment provides a semiconductor device. The semiconductor device includes a source, a drain, and a gate configured to selectively enable a current to pass between the source and the drain. The semiconductor device includes a drift zone between the source and the drain and a first field plate adjacent the drift zone. The semiconductor device includes a dielectric layer electrically isolating the first field plate from the drift zone and charges within the dielectric layer close to an interface of the dielectric layer adjacent the drift zone.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

While the following embodiments are illustrated and described with reference to n-channel metal-oxide semiconductor field effect transistors (MOSFETs), the embodiments are also applicable to p-channel MOSFETs having opposite dopings and charges.

Figure 1:
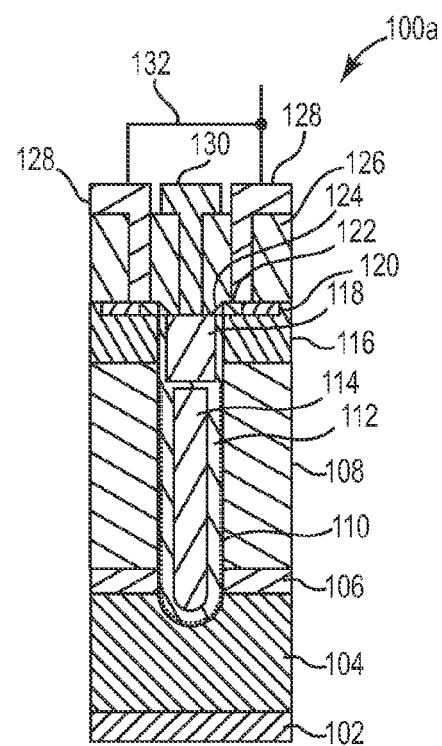
FIG. 1 illustrates a cross-sectional view of one embodiment of a power metal-oxide semiconductor field effect transistor (MOSFET).

FIG. 1 illustrates a cross-sectional view of one embodiment of a power MOSFET 100a. Power MOSFET 100a includes a drain 102, a doped substrate 104, a field stop region 106, a drift zone 108, positive charges 110, a dielectric material 112, a field plate 114, a channel or body region 116, a gate 118, a body contact region 120, a source region 122, dielectric material 126 and optional 124, source contacts 128, and a gate contact 130. In one embodiment, positive charges 110 provide for a vertical accumulation channel through drift zone 108 with a carrier density above approximately $10^{11}/cm^2$. The vertical accumulation channel reduces the on-resistance compared to typical power MOSFETs that do not include positive charges 110.

In one embodiment, drain 102 includes Cu, Al, W, or another suitable conductive material. The top of drain 102 contacts the bottom of doped substrate 104. In one embodiment, doped substrate 104 includes n+ doped Si or another suitable semiconductor material. A first portion of the top of doped substrate 104 contacts the bottom of field stop layer 106. In one embodiment, field stop layer 106 is excluded and the first portion of the top of doped substrate 104 contacts the bottom of drift zone 108. A second portion of the top of doped substrate 104 may contact the bottom of dielectric material 112.

In one embodiment, dielectric material 112 includes $SiO_2$ or another suitable dielectric material. Positive charges 110 are located within dielectric material 112 preferably near the outer surface or interface of dielectric material 112 adjacent drift zone 108, field stop region 106, and doped substrate 104. In one embodiment, positive charges 110 are provided by Cs or another suitable electropositive material. Dielectric material 112 contacts the top, bottom, and sidewalls of field plate 114 and electrically isolates field plate 114 from drift zone 108 and gate 118. In one embodiment, field plate 114 includes polysilicon or another suitable conductive material.

Drift zone 108 laterally surrounds dielectric material 112. In one embodiment, drift zone 108 includes n doped Si. The top of drift zone 108 contacts the bottom of channel region 116. In one embodiment, channel region 116 includes p+ doped Si. The top of channel region 116 contacts the bottom of body contact region 120 and source region 122. In one embodiment, body contact region 120 includes p+ doped Si. In one embodiment, source region 122 includes n+ doped Si.

Dielectric material 124 electrically isolates source region 122 from gate 118. In one embodiment, dielectric material 124 includes $SiO_2$, SiN, or another suitable dielectric material. Dielectric material 124 being different from dielectric material 126 as shown in FIG. 1 is optional, dielectric materials 124 and 126 may be identical and thus not distinguishable. The top of body contact region 120 and source region 122 contact the bottom of source contacts 128. In one embodiment, source contacts 128 include Cu, Al, W, or another suitable contact material. Source contacts 128 are electrically coupled together via source signal path 132. In one embodiment, field plate 114 is electrically coupled to source signal path 132.

In one embodiment, gate 118 includes polysilicon or another suitable conductive material. The top of gate 118 contacts the bottom of gate contact 130. In one embodiment, gate contact 130 includes Cu, Al, W, or another suitable conductive material. Dielectric material 126 laterally surrounds source contacts 128 and gate contact 130. In one embodiment, dielectric material 126 includes $SiO_2$, SiN, or another suitable dielectric material.

In one embodiment, Cs or another suitable electropositive material is deposited over a dielectric layer to provide positive charges 110 within dielectric material 112. In another embodiment, Cs or another suitable electropositive material is implanted into dielectric material 112 to provide positive charges 110. Positive charges 110 are preferably provided near the interface between dielectric material 112 and drift zone 108, but preferably not at the interface to prevent a reduction in carrier mobility in the accumulation channel through drift zone 108. The distance between the positive charges 110 and drift zone 108 is preferably selected such that carriers having a typical kinetic energy have a small probability of tunneling such that positive charges 110 cannot neutralize them. In one embodiment, positive charges 110 are located adjacent drift zone 108 and do not affect channel region 116. Therefore, increasing the surface charge density due to positive charges 110 reduces the on-resistance of power MOSFET 100a. In another embodiment, for a p-channel MOSFET, the positive charges are replaced with negative charges.

In one embodiment, where dielectric material 112 is $SiO_2$, the charge (Q) in the accumulation channel for a voltage (U) across dielectric material 112 of 10V and a thickness ($d_{Oxide}$) of dielectric material 112 of 80 nm is given by:

$$Q = \frac{1}{e_0} \cdot C \cdot U = \frac{1}{e_0} \varepsilon_{Oxide} \cdot \varepsilon_0 \cdot \frac{1}{d_{Oxide}} \cdot U = \qquad \text{Equation I}$$

$$\frac{4 \cdot 8.85 \cdot 10^{-14} As \cdot 10 \text{ V}}{1.6 \cdot 10^{-19} \text{ AsVcm} \cdot 80 \cdot 10^{-7} \text{ cm}} = 2.8 \cdot 10^{12} cm^{-2}$$

where:
$e_0$ is the elementary charge;
C is the capacitance of dielectric material 112;
$\in_{Oxide}$ is the dielectric constant of $SiO_2$; and
$\in_0$ is permittivity in a vacuum.

In the blocking state, field plate 114 compensates for positive charges 110. In one embodiment, the source potential is applied to field plate 114 and the thickness of dielectric material 112 is sufficient to maintain stability. In one embodiment, with a maximum permissible electrical field strength of approximately 2 MV/cm and a blocking capability of approximately 200V, the thickness of dielectric material 112 is at least approximately 1 μm (at least in the proximity of doped substrate 104). Therefore in one embodiment, for a charge density of $3 \cdot 10^{12}/cm^2$ provided by positive charges 110, U is provided as follows:

$$U = \frac{Q \cdot e_0}{C} = \frac{Q \cdot e_0 \cdot d_{Oxide}}{\varepsilon_{Oxide} \cdot \varepsilon_0} = \qquad \text{Equation II}$$

-continued $$\frac{3 \cdot 10^{12} \cdot 1.6 \cdot 10^{-19} \text{ As} \cdot \text{Vcm} \cdot 1 \cdot 10^{-6} \text{ cm}}{\text{cm}^2 \cdot 4 \cdot 8.85 \cdot 10^{-14} \text{ As}} = 135 \text{ V}$$

In operation in the on-state, gate 118 is selected to pass a current through channel region 116, drift zone 108, field stop region 106, and doped substrate 102 between source contacts 128 and drain 102. In the on-state, positive charges 110 generate a vertical accumulation region through drift zone 108, which reduces the on-resistance compared to typical power MOSFETs. In the off-state, field plate 114 compensates for positive charges 110, which increases the blocking voltage compared to typical power MOSFETs with the same doping and/or amount of fixed positive charges in the drift region.

Figure 2:
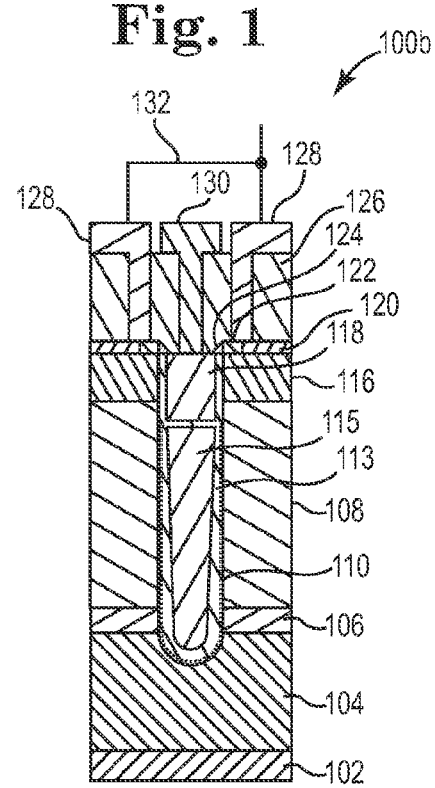
FIG. 2 illustrates a cross-sectional view of another embodiment of a power MOSFET.

FIG. 2 illustrates a cross-sectional view of another embodiment of a power MOSFET 100b. Power MOSFET 100b is similar to power MOSFET 100a previously described and illustrated with reference to FIG. 1, except that in power MOSFET 100b dielectric material 113 and field plate 115 are used in place of dielectric material 112 and field plate 114. In this embodiment, field plate 115 is tapered such that it is wider near gate 118 and narrower near drain 102. Dielectric material 113 contacts the bottom and sidewalls of tapered field plate 115 and electrically isolates tapered field plate 115 from drift zone 108 and gate 118. Dielectric material 113 gradually increases in thickness such that dielectric material 113 is thinner near gate 118 and thicker near drain 102. Since the potential in drift zone 108 near channel region 116 is lower than the potential near drain 102, the thickness of dielectric material 113 is gradually increased toward drain 102 to improve the blocking capability of power MOSFET 100b.

In another embodiment, dielectric material 113 increases in thickness in a step-like manner in place of the gradual transition. In this case, field plate 115 correspondingly decreases in width in a step-like manner in place of the gradual transition of the tapered field plate. Power MOSFET 100b operates similarly to power MOSFET 100a previously described and illustrated with reference to FIG. 2.

The following FIGS. 3-8 illustrate one embodiment of a method for fabricating a power MOSFET, such as power MOSFET 100b previously described and illustrated with reference to FIG. 2.

Figure 3:
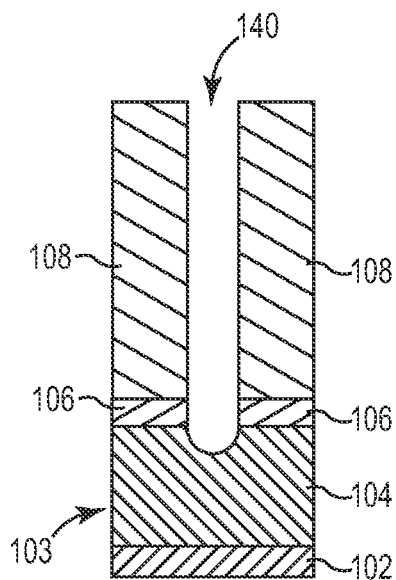
FIG. 3 illustrates a cross-sectional view of one embodiment of a drain and a substrate including a trench.

FIG. 3 illustrates a cross-sectional view of one embodiment of a drain 102 and a substrate 103 including a trench 140. In one embodiment, substrate 103 includes an n+ doped Si substrate 104, a field stop region 106 over n+ doped Si substrate 104, and a drift zone 108 over field stop region 106. In another embodiment, field stop region 106 is excluded such that drift zone 108 is over n+ doped substrate 104. Substrate 103 is etched to provide trench 140 extending through drift zone 108 and field stop region 106 into n+ doped substrate 104. In other embodiments, trench 140 does not reach Si substrate 104 and ends in field stop region 106 or in drift zone 108.

Figure 4:
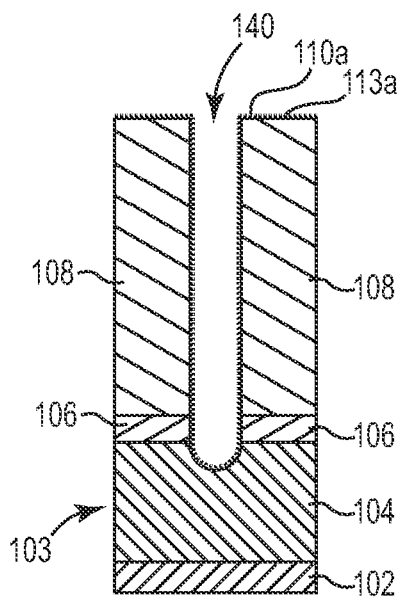
FIG. 4 illustrates a cross-sectional view of one embodiment of the drain, the substrate, a first dielectric material layer, and positive charges.

FIG. 4 illustrates a cross-sectional view of one embodiment of drain 102, substrate 103, a first dielectric material layer 113a, and positive charges 110a. In one embodiment, the exposed surface of substrate 103 is thermally oxidized to provide oxide or first dielectric material layer 113a. In another embodiment, a dielectric material, such as $SiO_2$ or another suitable dielectric material is deposited over exposed portions of substrate 103 to provide first dielectric material layer 113a. In this case, first dielectric material layer 113a is deposited using chemical vapor deposition (CVD), high density plasma-chemical vapor deposition (HDP-CVD), atomic layer deposition (ALD), metal organic chemical vapor deposition (MOCVD), plasma vapor deposition (PVD), jet vapor deposition (JVD), or other suitable deposition technique.

In one embodiment, Cs or another suitable electropositive material is then deposited on first dielectric material layer 113a to provide positive charges 110a. The electropositive material is deposited using CVD, HDP-CVD, ALD, MOCVD, PVD, JVD, or other suitable deposition technique. In another embodiment, an electropositive material is implanted into first dielectric material layer 113a to provide positive charges 110a. In another embodiment, a $SiO_2$ first dielectric material layer 113a is nitrated to provide positive charges 110a. The charge density is adjustable based on the surface concentration of positive charges 110a.

Figure 5:
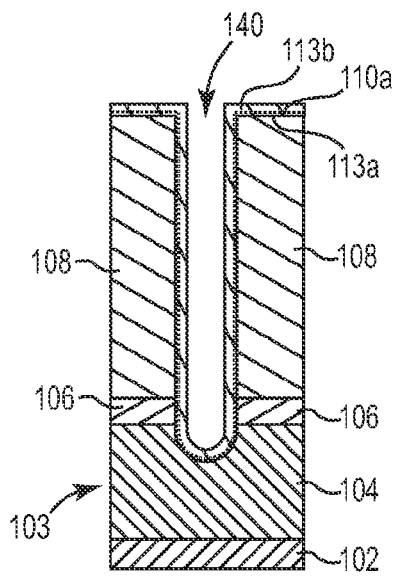
FIG. 5 illustrates a cross-sectional view of one embodiment of the drain, the substrate, the first dielectric material layer, the positive charges, and a second dielectric material layer.

FIG. 5 illustrates a cross-sectional view of one embodiment of drain 102, substrate 103, first dielectric material layer 113a, positive charges 110a, and a second dielectric material layer 113b. In one embodiment, a dielectric material having a faster etch rate than first dielectric material layer 113a is deposited over positive charges 110a and first dielectric material layer 113a to provide second dielectric material layer 113b. Second dielectric material layer 113b is deposited using CVD, HDP-CVD, ALD, MOCVD, PVD, JVD, or other suitable deposition technique.

In another embodiment, the same dielectric material as first dielectric material layer 113a is deposited over positive charges 110a and first dielectric material layer 113a to provide a dielectric material layer. The dielectric material layer is then damaged by implanting the dielectric material layer with heavy ions or by another suitable technique to provide second dielectric material layer 113b. In another embodiment, second dielectric material layer 113b consists of more than one dielectric layer with the upper layer exhibiting a higher etch rate than dielectric material layer 113a and lower parts of dielectric material layer 113b. By damaging the surface of second dielectric material layer 113b or by adding a material of higher etch rate, the surface of second dielectric material layer 113b has a faster etch rate than first dielectric material layer 113a.

Figure 6:
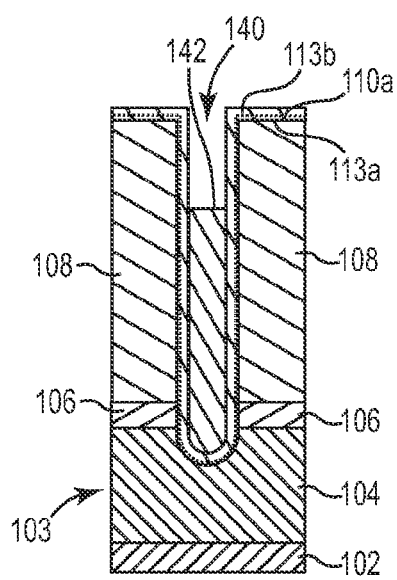
FIG. 6 illustrates a cross-sectional view of one embodiment of the drain, the substrate, the first dielectric material layer, the positive charges, the second dielectric material layer, and a hard mask material layer.

FIG. 6 illustrates a cross-sectional view of one embodiment of drain 102, substrate 103, first dielectric material layer 113a, positive charges 110a, second dielectric material layer 113b, and a hard mask material layer 142. A hard mask material, such a C or another suitable hard mask material is deposited over second dielectric material layer 113b. The hard mask material is deposited using CVD, HDP-CVD, ALD, MOCVD, PVD, JVD, or other suitable deposition technique. The hard mask material is then recess etched to expose portions of the sidewalls of second dielectric material layer 113b within trench 140 to provide hard mask material layer 142.

Figure 7:
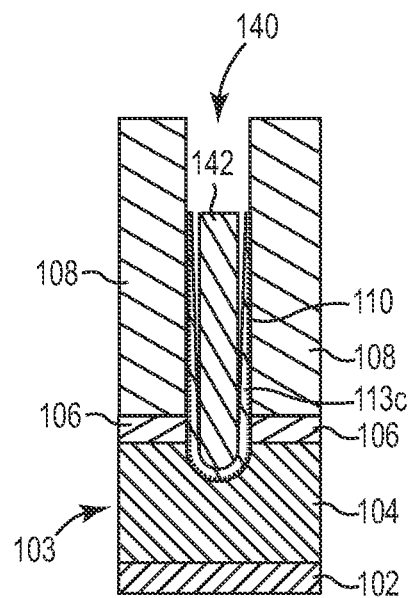
FIG. 7 illustrates a cross-sectional view of one embodiment of the drain, the substrate, a dielectric material layer, positive charges, and the hard mask material layer after etching portions of the second dielectric material layer, portions of the positive charges, and portions of the first dielectric material layer.

FIG. 7 illustrates a cross-sectional view of one embodiment of drain 102, substrate 103, dielectric material layer 113c, positive charges 110, and hard mask material layer 142 after etching portions of second dielectric material layer 113b, portions of positive charges 110a, and portions of first dielectric material layer 113a. Second dielectric material layer 113b, positive charges 110a, and first dielectric material layer 113a are preferably etched using an isotropic wet etch. During the etching process, the portions of second dielectric material layer 113b, the portions of positive charges 110a, and the portions of first dielectric material layer 113a above hard mask material layer 142 are removed to expose portions of the sidewalls of drift zone 108 within trench 140. The remaining portions of the dielectric material adjacent to hard mask material layer 142 provide dielectric layer 113c, which due to the etching gradually increases in thickness toward the bottom of trench 140. By adjusting the surface damage or the thickness and/or material of the upper part of dielectric layer 113b, the taper of final dielectric layer 113c can be adjusted. In another embodiment, without tapered dielectric material 113 as stated before, no isotropic etching of dielectric material 113 is performed and hard mask material 142 may be identical with later field plate material and field plate 115 resulting in a MOSFET as illustrated in FIG. 1.

Figure 8:
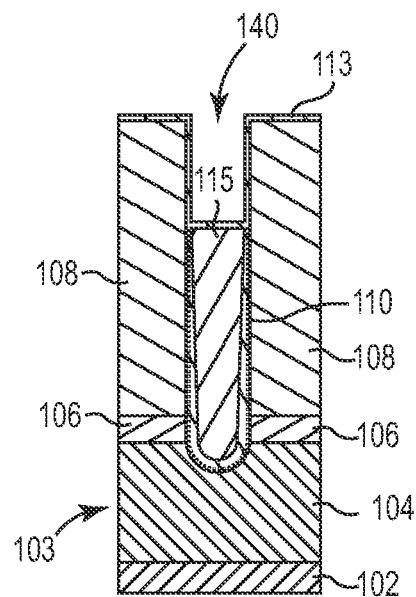
FIG. 8 illustrates a cross-sectional view of one embodiment of the drain, the substrate, a dielectric material layer, positive charges, and a field plate.

FIG. 8 illustrates a cross-sectional view of one embodiment of drain 102, substrate 103, dielectric material layer 113, positive charges 110, and a field plate 115. Hard mask material layer 142 is removed. In one embodiment, a dielectric material, such as $SiO_2$ or another suitable dielectric material is deposited over exposed portions of substrate 103 and dielectric material layer 113c to provide a dielectric material layer. The dielectric material layer is deposited using CVD, HDP-CVD, ALD, MOCVD, PVD, JVD, or other suitable deposition technique. In another embodiment, this dielectric material layer is excluded.

A field plate material, such as polysilicon or another suitable conductive material is then deposited over the dielectric material layer or exposed portions of the substrate 103 and dielectric material layer 113c. The field plate material is deposited using CVD, HDP-CVD, ALD, MOCVD, PVD, JVD, or other suitable deposition technique. The field plate material is recess etched to expose portions of the sidewalls of substrate 103 within trench 140 to provide tapered field plate 115. A dielectric material is then deposited or formed over exposed portions of field plate 115 and substrate 103 to provide dielectric material layer 113. Additional processes are performed to provide channel region 116, gate 118, body contact region 120, source region 120, source contacts 128, gate contact 130, and dielectric material 124 and 126 as previously described and illustrated with reference to FIGS. 1 and 2.

The following FIGS. 9-14 illustrate another embodiment of a method for fabricating a power MOSFET, such as power MOSFET 100b previously described and illustrated with reference to FIG. 2. To begin, the process previously described and illustrated with reference to FIGS. 3 and 4 is performed.

Figure 9:
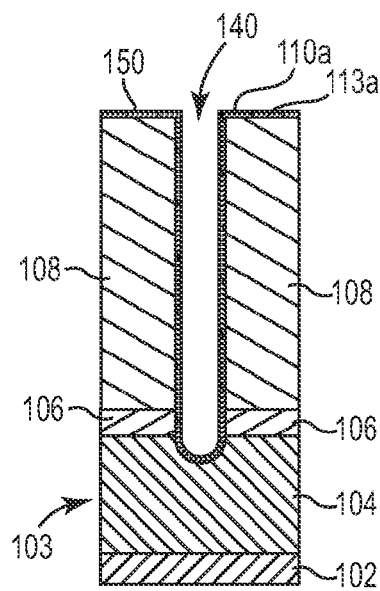
FIG. 9 illustrates a cross-sectional view of one embodiment of the drain, the substrate, the first dielectric material layer, the positive charges, and an etch stop material layer.

FIG. 9 illustrates a cross-sectional view of one embodiment of drain 102, substrate 103, first dielectric material layer 113a, positive charges 110a, and an etch stop material layer 150. An etch stop material, such as $Si_3N_4$ or another suitable etch stop material is deposited over first dielectric material layer 113a and positive charges 110a to provide etch stop material layer 150. Etch stop material layer 150 is deposited using CVD, HDP-CVD, ALD, MOCVD, PVD, JVD, or other suitable deposition technique.

Figure 10:
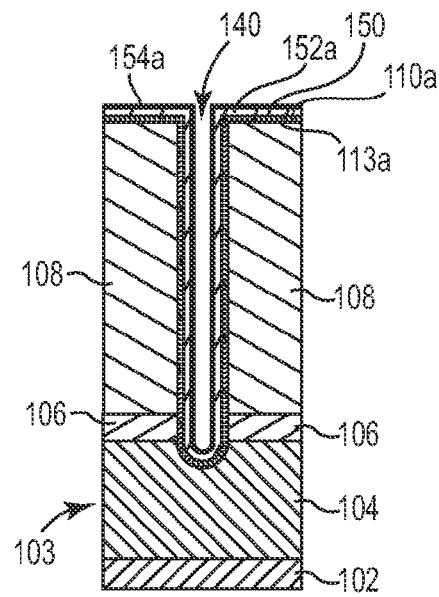
FIG. 10 illustrates a cross-sectional view of one embodiment of the drain, the substrate, the first dielectric material layer, the positive charges, the etch stop material layer, a silicon layer, and a second dielectric material layer.

FIG. 10 illustrates a cross-sectional view of one embodiment of drain 102, substrate 103, first dielectric material layer 113a, positive charges 110a, etch stop material layer 150, a silicon layer 152a, and a second dielectric material layer 154a. Polysilicon or amorphous silicon is deposited over etch stop material layer 150 to provide silicon layer 152a. Silicon layer 152a is deposited using CVD, HDP-CVD, ALD, MOCVD, PVD, JVD, or other suitable deposition technique. In one embodiment, a portion of silicon layer 152a is thermally oxidized to provide second dielectric material layer 154a. In another embodiment, a dielectric material, such as $SiO_2$ or another suitable dielectric material is deposited over silicon layer 152a to provide second dielectric material layer 154a.

Figure 11:
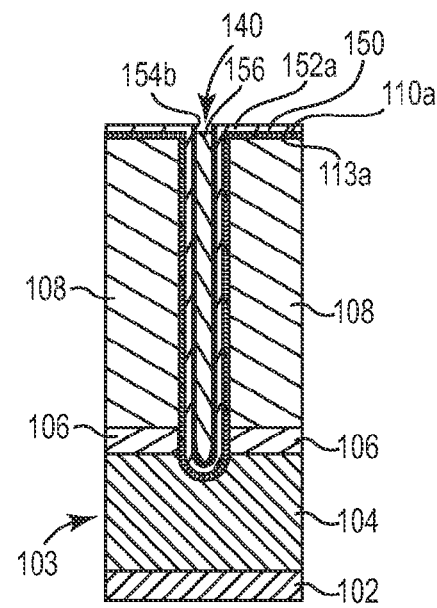
FIG. 11 illustrates a cross-sectional view of one embodiment of the drain, the substrate, the first dielectric material layer, the positive charges, the etch stop material layer, the silicon layer, the second dielectric material layer, and a hard mask material layer.

FIG. 11 illustrates a cross-sectional view of one embodiment of drain 102, substrate 103, first dielectric material layer 113a, positive charges 110a, etch stop material layer 150, silicon layer 152a, second dielectric material layer 154b, and a hard mask material layer 156. A hard mask material, such a C or another suitable hard mask material is deposited over second dielectric material layer 154a. The hard mask material is deposited using CVD, HDP-CVD, ALD, MOCVD, PVD, JVD, or other suitable deposition technique. The hark mask material is then recess etched to provide hard mask material layer 156 within trench 140. Second dielectric material layer 154a is etched to expose portions of silicon 152a outside trench 140 to provide second dielectric material layer 154b.

Figure 12:
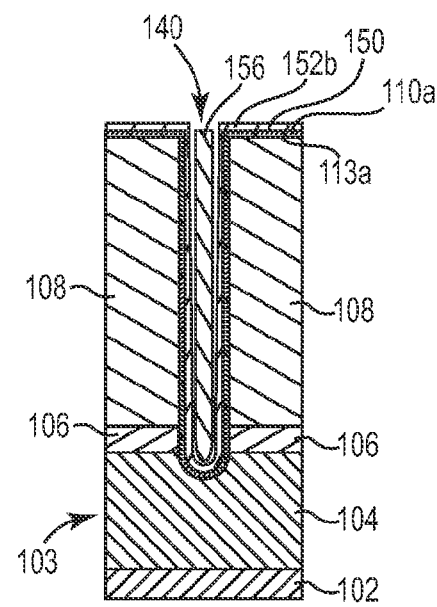
FIG. 12 illustrates a cross-sectional view of one embodiment of the drain, the substrate, the first dielectric material layer, the positive charges, the etch stop material layer, the silicon layer, and the hard mask material layer after etching the second dielectric material layer and portions of the silicon layer.

FIG. 12 illustrates a cross-sectional view of one embodiment of drain 102, substrate 103, first dielectric material layer 113a, positive charges 110a, etch stop material layer 150, silicon layer 152b, and hard mask material layer 156 after etching second dielectric material layer 154b and portions of silicon layer 152a. Second dielectric material layer 154b is etched. During the etching process, portions of silicon layer 152a are also etched such that silicon layer 152b is provided. Silicon layer 152b increases in thickness toward the bottom of trench 140.

Figure 13:
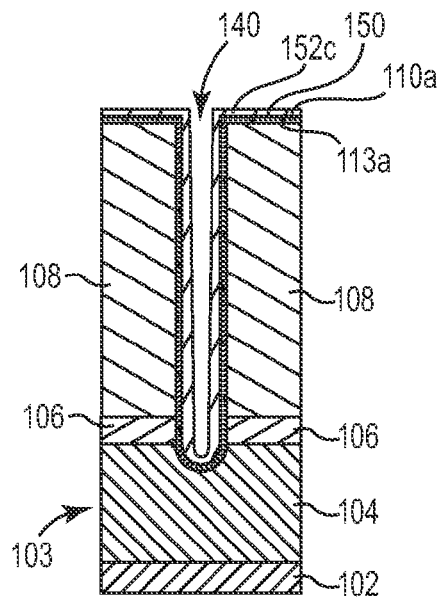
FIG. 13 illustrates a cross-sectional view of one embodiment of the drain, the substrate, the first dielectric material layer, the positive charges, the etch stop material layer, and a third dielectric material layer after oxidizing the silicon layer.

FIG. 13 illustrates a cross-sectional view of one embodiment of drain 102, substrate 103, first dielectric material layer 113a, positive charges 110a, etch stop material layer 150, and a third dielectric material layer 152c after oxidizing silicon layer 152b. Hard mask material layer 156 is removed. Silicon layer 152b is then thermally oxidized to provide oxide or third dielectric material layer 152c.

Figure 14:
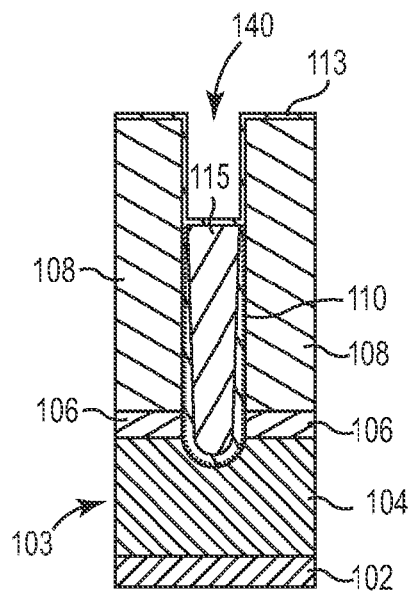
FIG. 14 illustrates a cross-sectional view of one embodiment of the drain, the substrate, a dielectric material layer, positive charges, and a field plate.

FIG. 14 illustrates a cross-sectional view of one embodiment of drain 102, substrate 103, a dielectric material layer 113, positive charges 110, and a field plate 115. A field plate material, such as polysilicon or another suitable conductive material is deposited over third dielectric material layer 152c. The field plate material is deposited using CVD, HDP-CVD, ALD, MOCVD, PVD, JVD, or other suitable deposition technique. The field plate material is recess etched to expose portions of the sidewalls of substrate 103 within trench 140 to provide tapered field plate 115.

The portions of third dielectric material layer 152c, the portions of positive charges 110a, and the portions of first dielectric material layer 113a above field plate 115 are also removed. A dielectric material is then deposited or formed over exposed portions of field plate 115 and substrate 103 to provide dielectric material layer 113. Additional processes are performed to provide channel region 116, gate 118, body contact region 120, source region 120, source contacts 128, gate contact 130, and dielectric material 124 and 126 as previously described and illustrated with reference to FIGS. 1 and 2.

Figure 15:
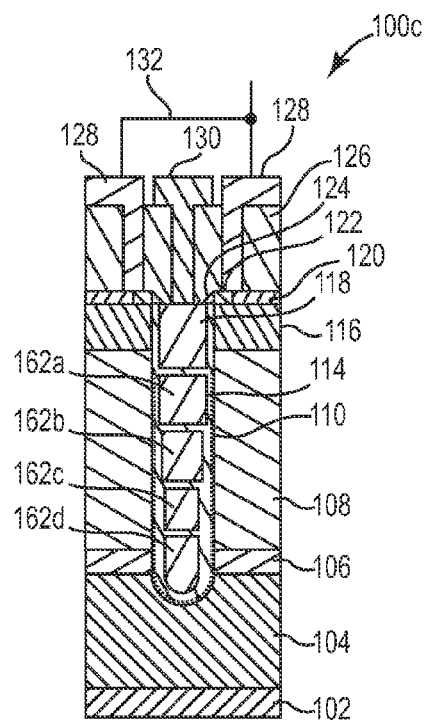
FIG. 15 illustrates a cross-sectional view of another embodiment of a power MOSFET.

FIG. 15 illustrates a cross-sectional view of another embodiment of a power MOSFET 100c. Power MOSFET 100c is similar to power MOSFET 100b previously described and illustrated with reference to FIG. 2, except that in power MOSFET 100c dielectric material 113 and field plate 115 are replaced with dielectric material 160 and field plates 162a-162d. In other embodiments, other suitable numbers of field plates are used. Field plates 162a-162d preferably decrease in width from field plate 162a to field plate 162d.

In one embodiment, a fixed potential, such as the source potential is applied to each field plate 162a-162d. In another embodiment, a different potential is applied to each field plate 162a-162d. In another embodiment, each field plate 162a-162d is floating. Field plates 162a-162d may be capacitively or resistively coupled together. For purely capacitively coupled field plates 162a-162d, the dielectric material 160 between the field plates has a high dielectric constant, which may lead to higher leakage currents. For purely resistively coupled field plates 162a-162d, the potentials applied by a voltage divider to each individual field plate ensure lower leakage currents but may increase switching times. Therefore, a combination of capacitive and resistive coupling can be used to provide fast switching times with a high impedance voltage divider, which leads to a balancing of the leakage currents and thus to stable potential conditions during the blocking state.

Figure 16:
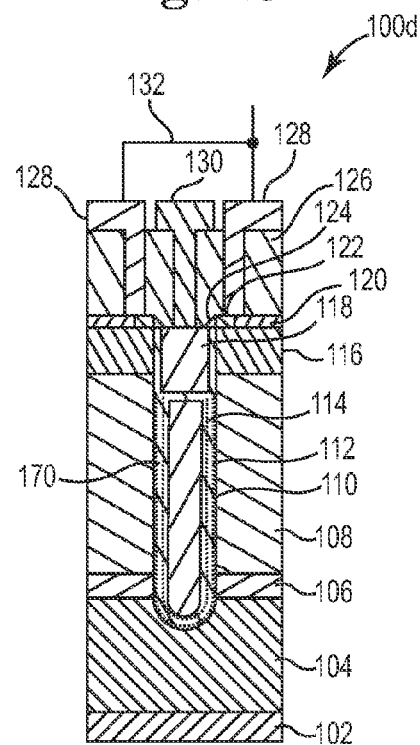
FIG. 16 illustrates a cross-sectional view of another embodiment of a power MOSFET.

FIG. 16 illustrates a cross-sectional view of another embodiment of a power MOSFET 100d. Power MOSFET 100d is similar to power MOSFET 100a previously described and illustrated with reference to FIG. 1, except that power MOSFET 100d includes negative charges 170. Negative charges, provided by Al or another suitable electronegative material are located within dielectric material 112 near the inner surface or interface of dielectric material 112 adjacent field plate 114. Negative charges 170 compensate for positive charges 110 in the off-state. In one embodiment, negative charges 170 are provided by depositing a thin $Al_2O_3$ layer over dielectric layer 112. The $Al_2O_3$ layer is deposited using ALD or another suitable deposition technique. Over the thin $Al_2O_3$ layer another thin $SiO_2$ layer is formed by deposition or by thermally oxidizing a thin deposited Si material. Doping of $SiO_2$ with small amounts of Al coming from the thin $Al_2O_3$ layer leads to negative oxide charges. In one embodiment, field plate 114 is excluded and replaced by a dielectric material, such as $SiO_2$ or another suitable dielectric material.

Figure 17:
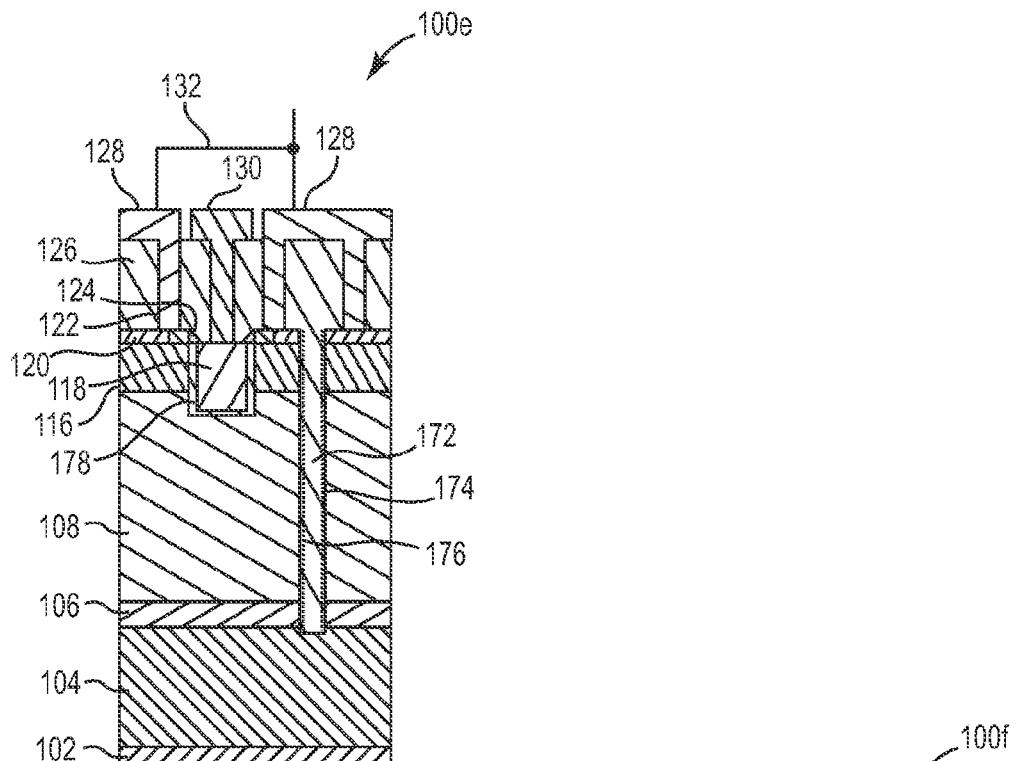
FIG. 17 illustrates a cross-sectional view of another embodiment of a power MOSFET.

FIG. 17 illustrates a cross-sectional view of another embodiment of a power MOSFET 100e. Power MOSFET 100e is similar to power MOSFET 100d previously described and illustrated with reference to FIG. 16, except that power MOSFET 100e includes dielectric material layer 172 including negative charges 174 and positive charges 176 and excludes field plate 114. Positive charges 176 are provided by Cs or another suitable electropositive material. Positive charges 176 are located within dielectric material layer 172 near the surface or interface of dielectric material layer 172 adjacent drift zone 108.

Negative charges 174 are provided by Al or another suitable electronegative material. Negative charges 174 are located within dielectric material 172 near the surface or interface of dielectric material layer 172 opposite positive charges 176. In the on-state, positive charges 176 provide a vertical accumulation region through drift zone 108, which reduces the on-resistance of power MOSFET 100e. In the off-state, negative charges 174 compensate for positive charges 176 to improve the blocking capability of power MOSFET 100e.

Figure 18:
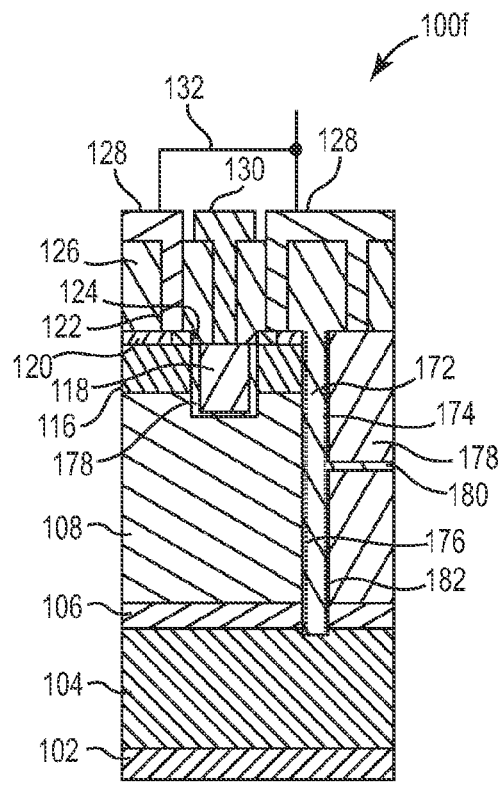
FIG. 18 illustrates a cross-sectional view of another embodiment of a power MOSFET.

FIG. 18 illustrates a cross-sectional view of another embodiment of a power MOSFET 100f. Power MOSFET 100f is similar to power MOSFET 100e previously described and illustrated with reference to FIG. 17, except that power MOSFET 100f includes field plates 178 and 182 and dielectric material 180. In other embodiments, other suitable numbers of field plates are used. Field plate 178 is electrically isolated from field plate 182 by dielectric material 180. The top of field plate 178 contacts source contact 128 and a sidewall of field plate 178 contacts dielectric material layer 172. A sidewall of field plate 182 contacts dielectric material layer 172. In one embodiment, the drain potential is applied to field plate 182. Field plates 178 and 182 provide additional compensation for positive charges 176 during the blocking state.

Figure 19:
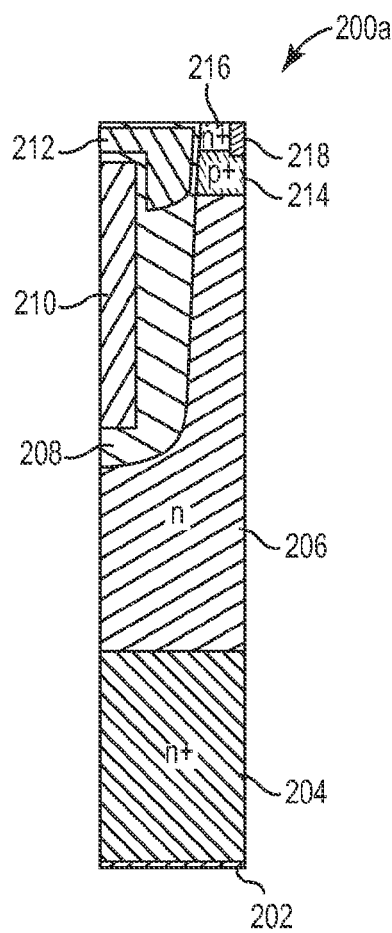
FIG. 19 illustrates a cross-sectional view of another embodiment of a power MOSFET.

FIG. 19 illustrates a cross-sectional view of another embodiment of a power MOSFET 200a. Power MOSFET 200a includes a drain 202, a doped substrate 204, a drift zone 206, a dielectric material 208, a field plate 210, a gate 212, a channel or body region 214, a source region 216, and a source contact 218. In one embodiment, dielectric material 208 includes positive charges distributed therein to provide a vertical accumulation channel through drift zone 206 in the on-state. The vertical accumulation channel reduces the on-resistance compared to typical power MOSFETs that do not include the positive charges.

In one embodiment, drain 202 includes Cu, Al, W, or another suitable conductive material. The top of drain 202 contacts the bottom of doped substrate 204. In one embodiment, doped substrate 204 includes n+ doped Si or another suitable semiconductor material. The top of doped substrate 204 contacts the bottom of drift zone 206. Drift zone 206 contacts the bottom and sidewalls of dielectric material 208. In one embodiment, dielectric material 208 is positively charged and includes $Al_2O_3$, SiN, or another suitable positively charged dielectric material. Dielectric material 208 contacts the top, bottom, and sidewalls of field plate 210 and electrically isolates field plate 210 from drift zone 206 and gate 212. In one embodiment, field plate 210 includes polysilicon or another suitable conductive material.

In one embodiment, drift zone 206 includes n doped Si. The top of drift zone 206 contacts the bottom of channel region 214. In one embodiment, channel region 214 includes p+ doped Si. In another embodiment p-doping of a portion of channel region 214 adjacent to dielectric material 208 is significantly reduced compared to part of the body or channel region being situated below the source contact 218. The top of channel region 214 contacts the bottom of source region 216 and source contact 218. In one embodiment, source region 216 includes n+ doped Si. In one embodiment, source contact 218 includes polysilicon or another suitable conductive material.

In one embodiment, dielectric material 208 is positively charged by using electron irradiation followed by an annealing process. In one embodiment, the annealing process is performed at about 350° C. In another embodiment, dielectric material 208 inherently includes positive charges, such that electron irradiation and annealing of the dielectric material is unnecessary.

In operation, in the on-state, positively charged dielectric material 208 generates a vertical accumulation region through drift zone 206, which reduces the on-resistance compared to typical power MOSFETs. In the off-state, field plate 210 compensates for positively charged dielectric material 208, which increases the blocking voltage compared to typical power MOSFETs.

Figure 20:
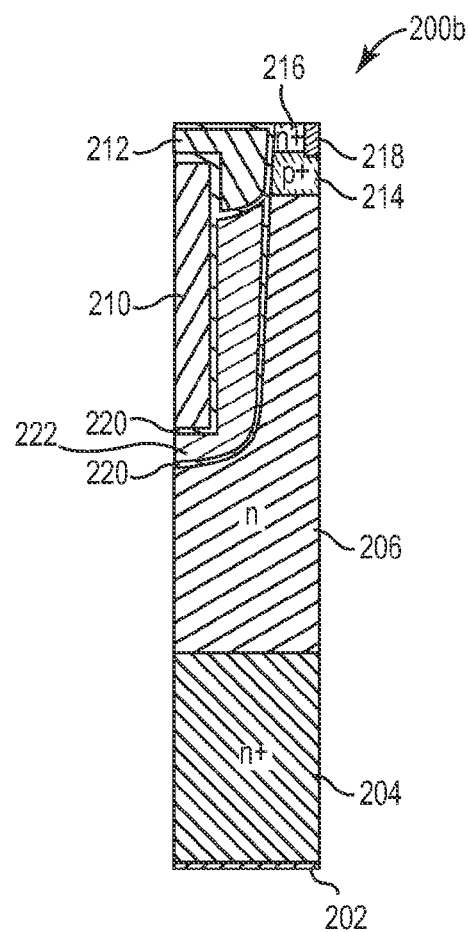
FIG. 20 illustrates a cross-sectional view of another embodiment of a power MOSFET.

FIG. 20 illustrates a cross-sectional view of another embodiment of a power MOSFET 200b. Power MOSFET 200b is similar to power MOSFET 200a previously described and illustrated with reference to FIG. 19, except that power MOSFET 200b includes dielectric material 220 and 222 in place of dielectric material 208. In this embodiment, dielectric material 222 includes positive charges provided by $Al_2O_3$ bulk material or another suitable electropositive dielectric material. Dielectric material 222 is surrounded by dielectric material 220, which provides the interface between dielectric material 222 and field plate 210 and between dielectric material 222 and drift zone 206. Dielectric material 222 is not positively charged or has only a small positive charge (e.g., below an area charge density of $10^{11}/cm^2$) and includes $SiO_2$ or another suitable dielectric material. By not having the positive charges at the interface between drift zone 206 and the dielectric material, carrier mobility in the accumulation region through drift zone 206 is improved.

Figure 21:
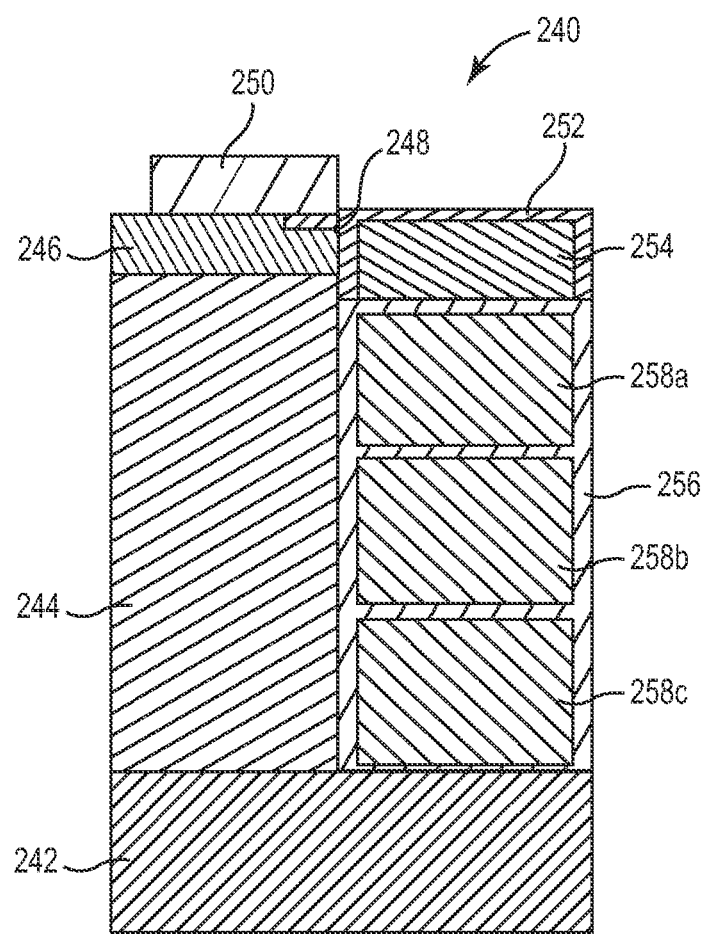
FIG. 21 illustrates a cross-sectional view of another embodiment of a power MOSFET.

FIG. 21 illustrates a cross-sectional view of another embodiment of a power MOSFET 240. Power MOSFET 240 includes a substrate/drain region 242, a drift zone 244, a channel or body region 246, a source region 248, a source contact 250, dielectric material 252, a gate 254, a dielectric material 256, and field plates 258a-258c. In one embodiment, dielectric material 256 is positively charged to provide a vertical accumulation channel through drift zone 244. The vertical accumulation channel reduces the on-resistance compared to typical power MOSFETs that do not include the positively charged dielectric material.

In one embodiment, substrate/drain region 242 includes n+ doped Si or another suitable semiconductor material. A first portion of the top of substrate/drain region 242 contacts the bottom of drift zone 244. A second portion of the top of substrate/drain region 242 contacts the bottom of dielectric material 256. Drift zone 244 contacts the sidewalls of dielectric material 256. In one embodiment, dielectric material 256 includes positive charges provided by $Al_2O_3$, SiN, or another suitable electropositive dielectric material. Dielectric material 256 contacts the top, bottom, and sidewalls of field plates 258a-258c and electrically isolates each field plate from each other and from drift zone 244 and gate 254. In one embodiment, field plates 258a-258c include polysilicon or another suitable conductive material.

In one embodiment, drift zone 244 includes n doped Si. The top of drift zone 244 contacts the bottom of channel region 246. In one embodiment, channel region 246 includes p doped Si. Channel region 246 contacts source region 248 and source contact 250. In one embodiment, source region 248 includes n+ doped Si. In one embodiment, source 250 includes Cu, Al, W, or another suitable conductive material.

In operation, in the on-state, the positive charges within dielectric material 256 generate a vertical accumulation region through drift zone 244, which reduces the on-resistance compared to typical power MOSFETs. In the off-state, field plates 258a-258c compensate for the positive charges within dielectric material 256, which increases the blocking voltage compared to typical power MOSFETs. In one embodiment, the potentials applied to field plates 258a-258c and the coupling between field plates 258a-258c are similar to the field plates 162a-162d previously described and illustrated with reference to FIG. 15.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing a semiconductor device, the method comprising:
    etching a trench into a doped semiconductor substrate including a drift zone and a drain region;
    forming a first dielectric layer over the substrate;
    providing positive charges over the first dielectric layer;
    depositing a second dielectric layer over the positive charges;
    depositing a hard mask material or conductive material in the trench;
    recess etching the hard mask material or the conductive material to expose portions of the second dielectric layer within the trench;
    etching the second dielectric layer, the positive charges, and the first dielectric layer to expose the sidewalls of the trench above the hard mask or the conductive material; and
    forming a third dielectric layer over the hard mask or conductive material layer and the exposed sidewalls of the trench.

2. The method of claim 1, wherein etching the second dielectric layer, the positive charges, and the first dielectric layer comprises etching the second dielectric layer, the positive charges, and the first dielectric layer to expose the sidewalls of the trench above the hard mask or the conductive material and to form a slope from the second dielectric layer adjacent the hard mask; the method further comprising:
    removing the hard mask;
    depositing a conductive material layer at least over the second dielectric layer; and
    recess etching the conductive material layer to expose portions of the sidewalls of the trench to provide a tapered field plate.

3. The method of claim 1, further comprising:
    forming a gate and a source region in the substrate.

4. The method of claim 1, further comprising:
    damaging the second dielectric layer such that the second dielectric layer has a faster etch rate than the first dielectric layer.

5. The method of claim 1, wherein depositing the second dielectric layer comprises depositing a second dielectric layer having a faster etch rate than the first dielectric layer.

6. The method of claim 1, wherein etching the trench into the doped semiconductor substrate comprises etching a trench through a field stop region between the drift zone and the drain region of the doped semiconductor substrate.

7. A method for manufacturing a semiconductor device, the method comprising:
    etching a trench into a doped semiconductor substrate including a drift zone and a drain region;
    forming a first dielectric layer over the substrate;
    providing positive charges over the first dielectric layer;
    depositing an etch stop material layer over the positive charges;
    depositing a silicon layer over the etch stop material layer;
    oxidizing a portion of the silicon layer;
    depositing a hard mask material in the trench;
    recess etching the hard mask material to expose portions of the oxidized silicon layer;
    etching the oxidized silicon layer and portions of the silicon layer to form a slope from the silicon layer on the sidewalls of the trench adjacent the hard mask;
    removing the hard mask;
    oxidizing the sloped silicon layer;
    depositing a conductive material layer over the oxidized sloped silicon layer;
    recess etching the conductive material layer to expose portions of the sidewalls of the trench to provide a tapered field plate; and
    forming a third dielectric layer over the conductive material layer and the exposed sidewalls of the trench.

8. The method of claim 7, wherein etching the oxidized silicon layer and portions of the silicon layer to form a slope from the silicon layer comprises etching using an isotropic oxide etch.

9. The method of claim 7, wherein forming the first dielectric layer over the substrate comprises thermally oxidizing the substrate.

10. The method of claim 7, further comprising:
    forming a gate and a source region in the substrate.

11. The method of claim 7, wherein etching the trench into the doped semiconductor substrate comprises etching a trench through a field stop region between the drift zone and the drain region of the doped semiconductor substrate.

12. The method of claim 7, wherein providing the positive charges comprising depositing an electropositive material over the first dielectric layer.

* * * * *